United States Patent
Ohlsson et al.

(10) Patent No.: US 12,495,524 B2
(45) Date of Patent: Dec. 9, 2025

(54) HEAT SPREADER FOR TRANSFERRING HEAT FROM AN ELECTRONIC HEAT SOURCE TO A HEAT SINK

(71) Applicant: HUAWEI TECHNOLOGIES CO., LTD., Shenzhen (CN)

(72) Inventors: Fredrik Ohlsson, Kista (SE); Vadim Tsoi, Kista (SE); Long Li, Dongguan (CN)

(73) Assignee: Huawei Technologies Co., Ltd., Shenzhen (CN)

(*) Notice: Subject to any disclaimer, the term of this patent is extended or adjusted under 35 U.S.C. 154(b) by 167 days.

(21) Appl. No.: 18/477,302

(22) Filed: Sep. 28, 2023

(65) Prior Publication Data

US 2024/0023281 A1  Jan. 18, 2024

Related U.S. Application Data (63) Continuation of application No. PCT/EP2021/058065, filed on Mar. 29, 2021.

(51) Int. Cl.
*H05K 7/20* (2006.01)

(52) U.S. Cl.
CPC ..... *H05K 7/20336* (2013.01); *H05K 7/20436* (2013.01)

(58) Field of Classification Search
CPC .............. H05K 7/20336; H05K 7/20436
USPC ........... 165/185, 104.21, 104.26, 104.33
See application file for complete search history.

(56) References Cited

U.S. PATENT DOCUMENTS

| | | | |
|---|---|---|---|
| 6,681,843 B2 * | 1/2004 | Sugito | F28D 15/0233 165/135 |
| 2003/0070792 A1 * | 4/2003 | Tanaka | F28F 9/0221 165/104.21 |
| 2017/0227296 A1 | 8/2017 | Mohaupt et al. | |
| 2018/0283798 A1 * | 10/2018 | Kim | F28D 15/0266 |

\* cited by examiner

*Primary Examiner* — Joel M Attey
(74) *Attorney, Agent, or Firm* — Leydig, Voit & Mayer, Ltd.

(57) ABSTRACT

A heat spreader for transferring heat from an electronic heat source to a heat sink, a system for cooling an electronic heat source, and a method for manufacturing a heat spreader are provided. The heat spreader includes a set of separate channels which are coupled with each other by an upper coupler and a lower coupler such that a cooling fluid circulates in the set of separate channels via the upper coupler and the lower coupler in operation.

20 Claims, 8 Drawing Sheets

HEAT SPREADER FOR TRANSFERRING HEAT FROM AN ELECTRONIC HEAT SOURCE TO A HEAT SINK

CROSS-REFERENCE TO RELATED APPLICATIONS

This application is a continuation of International Application No. PCT/EP2021/058065, filed on Mar. 29, 2021, the disclosure of which is hereby incorporated by reference in its entirety.

TECHNICAL FIELD

The present disclosure relates to a heat spreader for transferring heat from an electronic heat source to a heat sink. The present disclosure also relates to a system for cooling an electronic heat source, the system including a heat spreader of the above-mentioned sort. Furthermore, the present disclosure also relates to a method for manufacturing a heat spreader of the above-mentioned sort.

BACKGROUND

In many areas, for example within the field of telecommunications, electronic components generate a considerable amount of heat and may require cooling. By cooling the electronic component, the reliability and life-time of the electronic component can be increased. To be able to cool electronic components with high heat density (W/mm 2) it is beneficial to allow the heat to be spread over a larger surface, thus reducing the heat density. Devices for spreading heat, so called heat spreaders, have been developed for this purpose and can be arranged to spread the heat from an individual or a group of electronic heat sources over a larger area and transfer the heat to, e.g., a heat sink.

SUMMARY

Exemplary embodiments of the present disclosure provide a solution, which mitigates or solves the drawbacks and problems of conventional solutions.

According to a first aspect of the present disclosure, the above mentioned is achieved with a heat spreader for transferring heat from an electronic heat source to a heat sink, the heat spreader comprising:
  a front side configured to be thermally coupled to the electronic heat source;
  a back side arranged opposite to the front side and configured to be thermally coupled to the heat sink;
  a set of separate channels extending between an upper part of the heat spreader and a lower part of the heat spreader, wherein each separate channel comprises an upper channel part and a lower channel part; and
  an upper coupling means configured to couple the upper channel parts of the set of separate channels and a lower coupling means configured to couple the lower channel parts of the set of separate channels thereby allowing a cooling fluid to circulate in the set of separate channels via the upper coupling means and the lower coupling means in operation.

The back side and the front side may also be denoted back surface or back plane and front surface or front plane. Hence, the back side and front side may in examples be defined by extension planes.

Further, the expression "in operation" can be understood to mean when the heat spreader is in use, i.e., when thermally coupled to and heated by the electronic heat source. The cooling fluid comprised in the heat spreader can be in liquid form and/or in gas form. In operation, the cooling fluid can transfer heat based on transitions between the liquid form and gas form, i.e., based on evaporation and condensation. This can be referred to as a two-phase system.

The heat spreader can be substantially vertically arranged in operation with the upper part of the heat spreader facing upwards and the lower part of the heat spreader facing downwards such that the set of separate channels extend in the vertical plane. This can be beneficial from a gravity point of view and can further improve the circulation of the cooling fluid in the heat spreader.

An advantage of the heat spreader according to the first aspect is that it allows the cooling fluid to circulate, i.e., flow, between separate channels in the set of separate channels, resulting in an improved distribution and spread of the cooling fluid in the heat spreader. The heat spreader can hence spread the heat more efficiently over the heat spreader and the thermal efficiency of the heat spreader is improved. The heat spreader can be more thermal efficient compared to conventional heat spreaders such as copper vapor chambers, especially for heat spreaders larger than 100 mm×100 mm, as the main transport of liquid is thermosiphon mode which has less thermal resistance than vapor chamber transport. Furthermore, the upper coupling means and the lower coupling means provide a simple solution for coupling the set of channels with each other. The heat spreader can thereby be of a low cost design but with high thermal efficiency.

In an implementation of a heat spreader according to the first aspect, the cooling fluid is allowed to circulate in the heat spreader in gas form via the upper coupling means and in liquid form via the lower coupling means in operation.

An advantage with this implementation is that the principle of transferring heat based on evaporation and condensation can be used. Thereby, a reliable heat spreader can be provided, and the manufacturing costs can be reduced.

In an implementation of a heat spreader according to the first aspect,
  the upper coupling means comprises an upper elongated inner channel coupling the upper channel parts of the set of separate channels; and/or
  the lower coupling means comprises a lower elongated inner channel coupling the lower channel parts of the set of separate channels.

In an implementation of a heat spreader according to the first aspect,
  the upper elongated inner channel is partially formed by a separate upper cover part; and/or
  the lower elongated inner channel is partially formed by a separate lower cover part.

In an implementation of a heat spreader according to the first aspect,
  the separate upper cover part extends over and at least partially encloses the upper channel parts; and/or
  the separate lower cover part extends over and at least partially encloses the lower channel parts.

An advantage with these implementations related to the upper coupling means and the lower coupling means is that the set of separate channels can be coupled based on a small number of simple parts, thereby reducing the manufacturing costs of the heat spreader.

In an implementation of a heat spreader according to the first aspect, the set of separate channels extends in a plane substantially in parallel with an extension plane of the front side.

In an implementation of a heat spreader according to the first aspect, the set of separate channels is arranged in a row in the plane.

In an implementation of a heat spreader according to the first aspect, the set of separate channels extends in parallel to each other in the plane.

An advantage with these implementations related to the configuration of the set of channels is that a suitable and efficient design of the set of separate channels is provided which improves the thermal performance and reduces the manufacturing costs of the heat spreader. Furthermore, the design of the set of channels results in a heat spreader that can efficiently handle high internal pressure.

In an implementation of a heat spreader according to the first aspect, a fluid area of a separate channel is same or different in the set of channels.

In an implementation of a heat spreader according to the first aspect, a spatial distance between two adjacent separate channels is same or different in the set of separate channels.

An advantage with these implementations related to the capacity of and relative position in the set of channels is a flexible design of the set of separate channels which can be adapted to optimize the thermal performance for different use cases of the heat spreader.

In an implementation of a heat spreader according to the first aspect, the fluid area and/or the spatial distance is dependent on a spatial distance to the electronic heat source.

In an implementation of a heat spreader according to the first aspect, the fluid area decreases with an increasing spatial distance to the electronic heat source and/or the spatial distance increases with an increasing spatial distance to the electronic heat source.

An advantage with these implementations related to spatial distance to the electronic heat source is that the design of set of channels can be adapted to optimize the thermal performance close to the electronic heat source.

In an implementation of a heat spreader according to the first aspect, the set of separate channels comprises inner grooves and/or inner ribs.

An advantage with this implementation is that the inner surface area of the separate channels is increased, thereby improving the thermal performance of the set of channels.

In an implementation of a heat spreader according to the first aspect, the set of separate channels comprises a wick structure.

A wick structure can herein be understood to mean a porous structure for capillary fluid transport. The wick structure may be arranged inside one or more of the separate channels and further adjacent to the electronic heat source.

An advantage with this implementation is that the wick structure can improve the thermal performance of the heat spreader and further prevent dry out in areas with highest heat fluxes.

In an implementation of a heat spreader according to the first aspect, the electronic heat source is arranged at a center part or a lower part of the front side.

An advantage with this implementation is that the circulation of the cooling fluid can be improved with the help of gravity, thereby improving the thermal performance of the heat spreader.

According to a second aspect of the present disclosure, the above mentioned is achieved with a system for cooling an electronic heat source, the system comprising:
 an electronic heat source,
 a heat sink, and
 a heat spreader according to any one of the implementations of the head spreader according to the first aspect.

An advantage of the system according to the second aspect is that an improved heat transfer between the electronic heat source and the heat sink can be provided. Further advantages correspond to the advantages of the heat spreader and its implementations according to the first aspect.

According to a third aspect of the present disclosure, the above mentioned is achieved with a method for manufacturing a heat spreader for transferring heat from an electronic heat source to a heat sink, the method comprising:
 forming a set of separate channels extending between an upper part of the heat spreader and a lower part of the heat spreader, wherein each separate channel comprises an upper channel part and a lower channel part,
 forming an upper coupling means and coupling the upper coupling means with the upper channel parts of the separate channels,
 forming a lower coupling means and coupling the lower coupling means with the lower channel parts of the separate channels, and
 filling a cooling fluid into the set of separate channels thereby allowing the cooling fluid to circulate in the set of separate channels via the upper coupling means and the lower coupling means in operation.

The method according to the third aspect may be extended to manufacture a heat spreader according to any of the implementations according to the first aspect. Advantages of the method correspond to the advantages of the heat spreader according to the first aspect and the system according to the second aspect and their implementations.

Further applications and advantages of the embodiments of the present disclosure will be described in detail in the followings.

BRIEF DESCRIPTION OF THE DRAWINGS

The appended drawings are intended to clarify and explain different embodiments of the present disclosure, in which.

DETAILED DESCRIPTION

A heat spreader can be arranged between an electronic component, e.g., a central processing unit (CPU), and a heat sink to transfer and spread heat from the electronic component to the heat sink. Conventional heat spreaders are made in a material with high thermal conductivity such as, e.g., copper or aluminium and can be solid or comprise a liquid. One type of heat spreaders is based on a vapor chamber with a liquid enclosed by a metal casing. The liquid evaporates near the heat source by the heat from the heat source and condensates in other areas of the heat spreader where the temperature is lower. This can be referred to as a two-phase system. To achieve highest possible thermal conductivity and to be able to use preferred liquids the vapor chamber is typically made in copper or copper alloy material.

Another type of heat spreader is made of an extruded aluminum profile, a so called multi port extrusion (MPE), with a plurality of sealed channels filled with liquid. Each channel can here be considered as an individual two-phase system. This type of heat spreader is less thermally efficient then the vapor chamber of copper, but its cost, weight and simplicity are important advantages.

The existing vapor chamber's design, material and complexity make the cost for each vapor chamber relatively high. The thermal performance of the aluminum heat spreader is lower and not suitable for all heat spreading applications. Using a solid copper spreader also have a relative high cost and limited thermal conductivity.

According to embodiments of the present disclosure, an improved head spreader is therefore provided which has a low-cost design and high thermal performance. The heat spreader according to the present disclosure comprises a set of separate channels coupled to each other such that a cooling fluid in both liquid form and gas form can circulate between the separate channels in operation. Thereby, spreading heat more efficiently over a larger area.

Figure 1A:
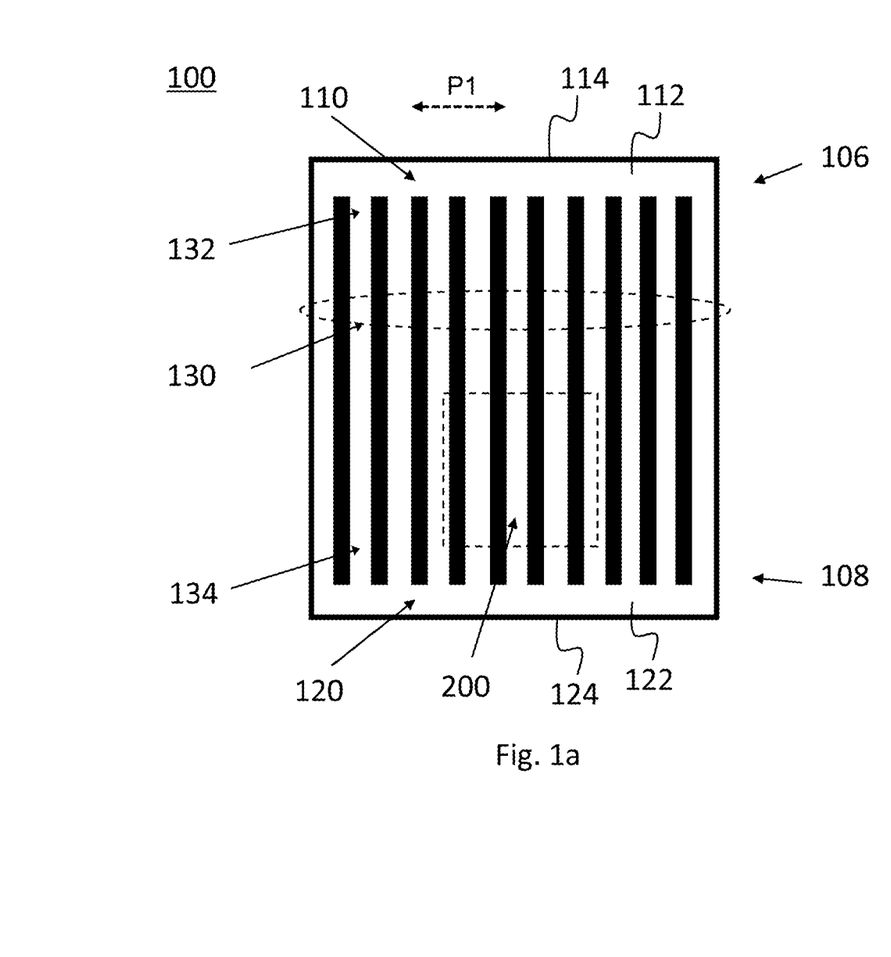
FIGS. 1a-b schematically illustrate two different views of a heat spreader according to an embodiment of the present disclosure.
Figure 1B:
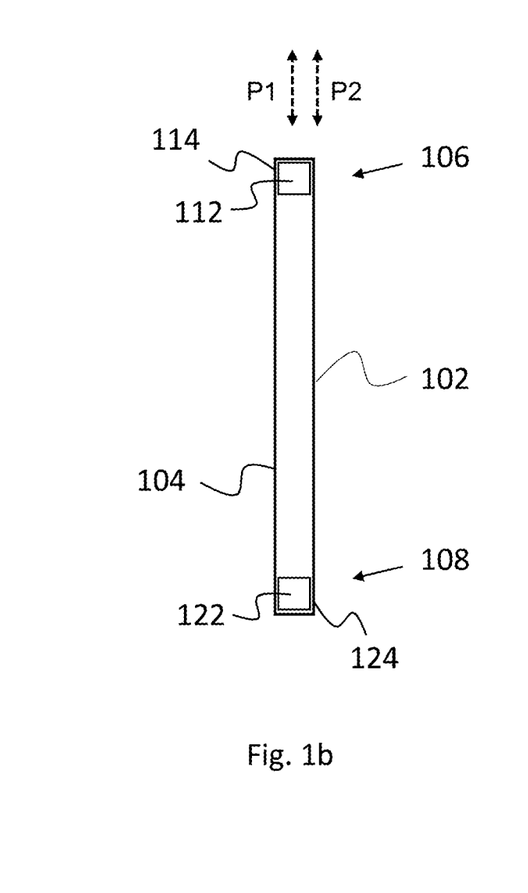

FIGS. 1a-b schematically illustrate a heat spreader 100 according to an embodiment of the present disclosure for transferring heat from an electronic heat source 200 to a heat sink 300. With reference to FIG. 1b, the heat spreader 100 comprises a front side 102 and a back side 104 arranged opposite to the front side 102. The front side 102 is configured to be thermally coupled to the electronic heat source 200 and the back side 104 is configured to be thermally coupled to the heat sink 300. The heat spreader 100 can hence be arranged between the electronic heat source 200 and heat sink 300 with the front side 102 thermally coupled to the electronic heat source 200 and the back side 104 thermally coupled to the heat sink 300. Thereby, allowing the heat spreader 100 to transfer heat from the electronic heat source 200 to the heat sink 300 in operation.

With reference to FIG. 1a, the heat spreader 100 comprises a set of separate channels 130 extending between an upper part 106 of the heat spreader 100 and a lower part 108 of the heat spreader 100. Each separate channel 130 comprises an upper channel part 132 and a lower channel part 134 and is configured to allow a cooling fluid to flow through the separate channel 130.

The heat spreader 100 further comprises an upper coupling means 110 configured to couple the upper channel parts 132 of the set of separate channels 130 and a lower coupling means 120 configured to couple the lower channel parts 134 of the set of separate channels 130. Thus, the upper channel parts 132 of the set of separate channels 130 are connected with each other through the upper coupling means 110 and the lower channel parts 134 of the set of separate channels 130 are connected with each other through the lower coupling means 120. The upper coupling means 110 and the lower coupling means 120 thereby allows a cooling fluid to circulate in the set of separate channels 130 via the upper coupling means 110 and the lower coupling means 120 in operation. In other words, the cooling fluid can circulate, i.e., flow, between separate channels in the set of separate channels 130, i.e., from one separate channel to another separate channel, via the upper coupling means 110 and the lower coupling means 120.

The heat spreader 100 is filled with a cooling fluid which in operation, i.e., when the head spreader 100 is used to transfer heat from an electronic heat source 200 to a heat sink 300, circulates in the heat spreader 100 as described above. Thereby, spreading heat generated by the electronic heat source 200 over the heat spreader 100. The cooling fluid can be in liquid form and/or in gas form and the circulation of the cooling fluid in operation can be driven by the transitions between the liquid form and gas form. In embodiments, the cooling fluid is allowed to circulate in the heat spreader 100 in gas form via the upper coupling means 110 and in liquid form via the lower coupling means 120 in operation, as schematically illustrated in FIG. 2.

Figure 2:
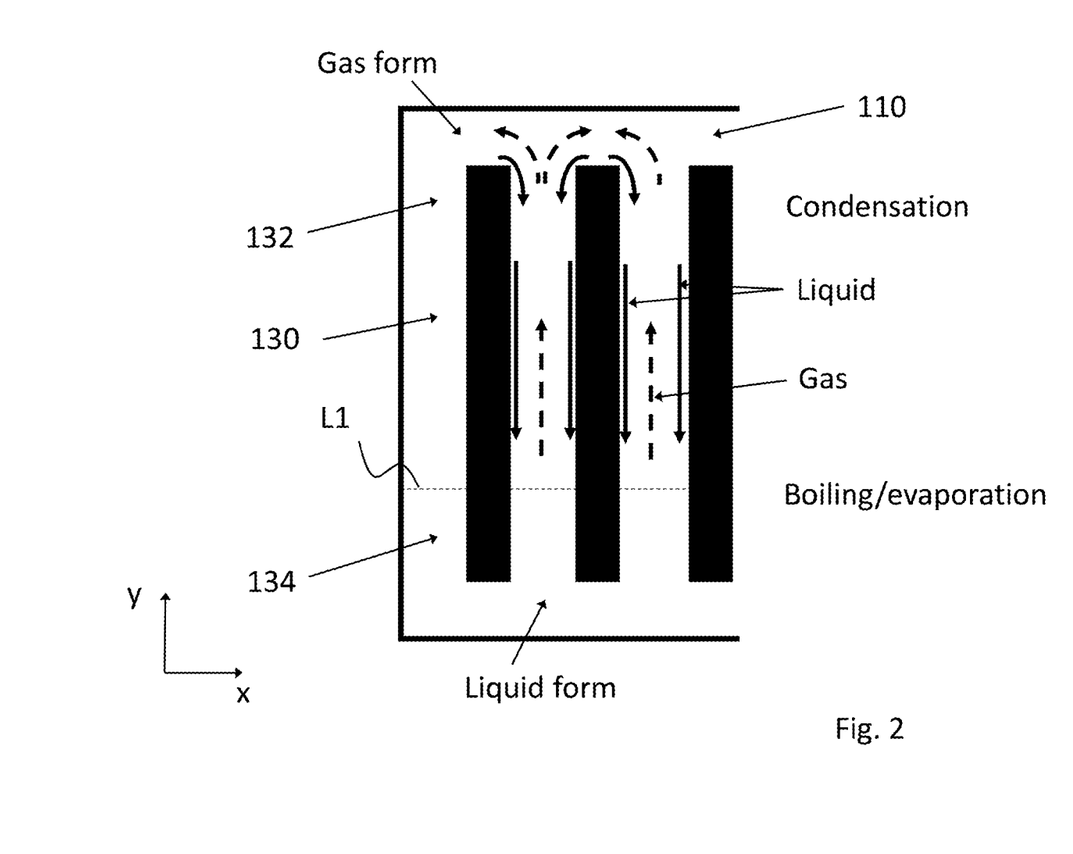
FIG. 2 schematically illustrates a section view of a part of a heat spreader according to an embodiment of the present disclosure.

FIG. 2 schematically illustrates circulation of the cooling fluid in a part of the heat spreader 100 according to an embodiment of the present disclosure. The cooling fluid may be in a liquid form (full arrows) at the lower part 108 of the heat spreader 100. With reference to FIG. 2, the cooling fluid may be in the liquid form in the lower coupling means 120 and the lower channel parts 134 of the set of separate channels 130 up to a first level L1 but is not limited thereto. The first level L1 may be adjusted based on requirements and conditions associated with the use case of the heat spreader.

When in operation, the heat from the electronic heat source 200 causes the cooling fluid to evaporate into gas form and circulate upwards in one or more separate channels 130 towards the upper channel parts 132 and into the upper coupling means 110, as indicated with dashed arrows in FIG. 2. In the upper coupling means 110 and/or the upper channel parts 132 the temperature is lower, and the cooling fluid condenses back to the liquid form. As the set of separate channels 130 are coupled to each other by the upper coupling means 110 and the lower coupling means 120, the cooling fluid can circulate in both the x- and y-direction, indicated in FIG. 2. The circulation of the cooling fluid in the heat spreader 100 is thereby improved and heat can be spread more efficiently over the whole heat spreader 100.

In embodiments, the upper coupling means 110 comprises an upper elongated inner channel 112 coupling the upper channel parts 132 of the set of separate channels 130. With reference to FIG. 1a, the upper elongated inner channel 112 may extend in a first plane P1 from one side of the head spreader 100 to another opposite side of the heat spreader 100. The upper elongated inner channel 112 may further extend essentially perpendicular to the extension of the set of separate channels 130. The upper channel parts 132 of each separate channel 130 may connect to the upper elongated inner channel 112, hence connecting the separate channels 130 in the set of separate channels 130 with each other via the upper elongated inner channel 112. The upper elongated inner channel 112 may be partially formed by a separate upper cover part 114. The separate upper cover part 114 may extend over and at least partially enclose the upper channel parts 132, as will be further described below with reference to FIG. 9.

In a similar way, the lower coupling means 120 may comprises a lower elongated inner channel 122 coupling the lower channel parts 134 of the set of separate channels 130. The lower elongated inner channel 122 may extend in the first plane P1 from one side of the head spreader 100 to another opposite side of the heat spreader 100. The lower elongated inner channel 122 may further extend essentially perpendicular to the extension of the set of separate channels 130. The lower elongated inner channel 122 may be partially formed by a separate lower cover part 124. The separate lower cover part 124 may extend over and at least partially enclose the lower channel parts 134.

With reference to FIGS. 1a-b, the set of separate channels 130 may extends in the plane P1 substantially in parallel with an extension plane P2 of the front side 102. The set of separate channels 130 may be arranged in a row in the plane P1, e.g., in a row extending in the plane P1 from one side of the head spreader 100 to another opposite side of the heat spreader 100. The set of separate channels 130 may further extends in parallel to each other in the plane P1.

The shape, dimension, and orientation of the separate channels may be adapted to different applications and may be the same or different for the separate channels in the set of separate channels 130. For example, a fluid area of a separate channel may be the same or different in the set of channels 130. The fluid area may be defined as an area of a cross-section of the separate channel in a plane perpendicular to the extension of the separate channel and may determine the flow capacity of the separate channel. Furthermore, a spatial distance between two adjacent separate channels may be the same or different in the set of separate channels 130.

Figure 3:
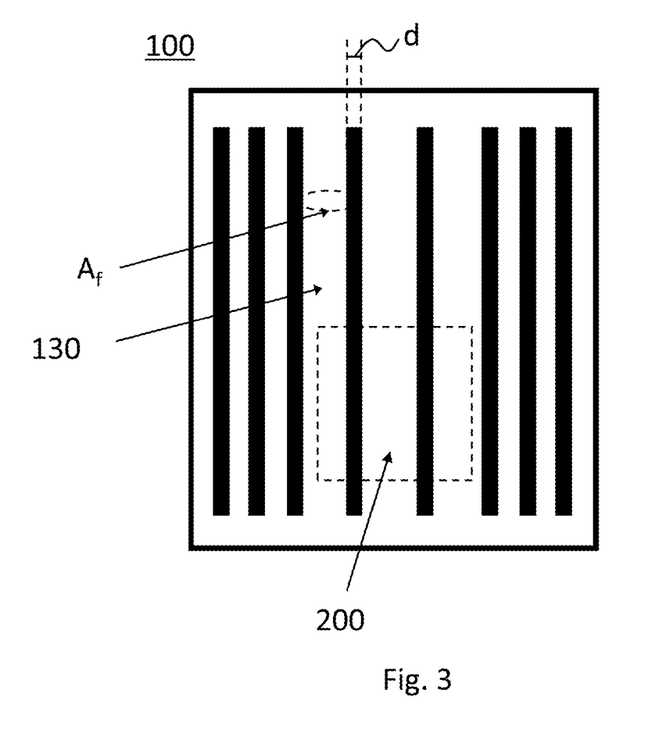
FIG. 3 schematically illustrates a section view of a heat spreader according to an embodiment of the present disclosure.
Figure 4:
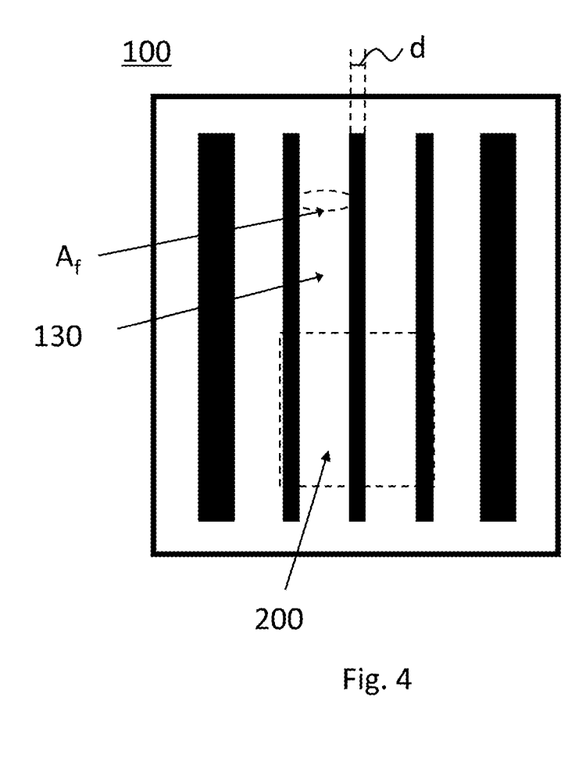
FIG. 4 schematically illustrates a section view of a heat spreader according to an embodiment of the present disclosure.

In the embodiment shown in FIGS. 1a-b, the fluid area of the separate channels is the same and the spatial distance between two adjacent separate channels is also the same. FIG. 3 schematically illustrates a heat spreader 100 where the fluid area $A_f$ of the separate channels 130 is different but the spatial distance d between two adjacent separate channels 130 is the same. FIG. 4 schematically illustrates a heat spreader 100 where the fluid area $A_f$ of the separate channels 130 is the same but the spatial distance d between two adjacent separate channels 130 is different.

In embodiments, the fluid area and/or the spatial distance is dependent on a spatial distance to the electronic heat source 200. With reference to FIGS. 3, the fluid area may decrease with an increasing spatial distance to the electronic heat source 200. In this way, the separate channels at or near the electronic heat source 200 have a larger fluid area and can provide an improved flow of the cooling liquid where it is most needed. With reference to FIGS. 4, the spatial distance may increase with an increasing spatial distance to the electronic heat source 200. In this way, the separate channels are closer together at or near the electronic heat source 200 thereby providing an improved flow of the cooling liquid where it is most needed.

Figure 5A:
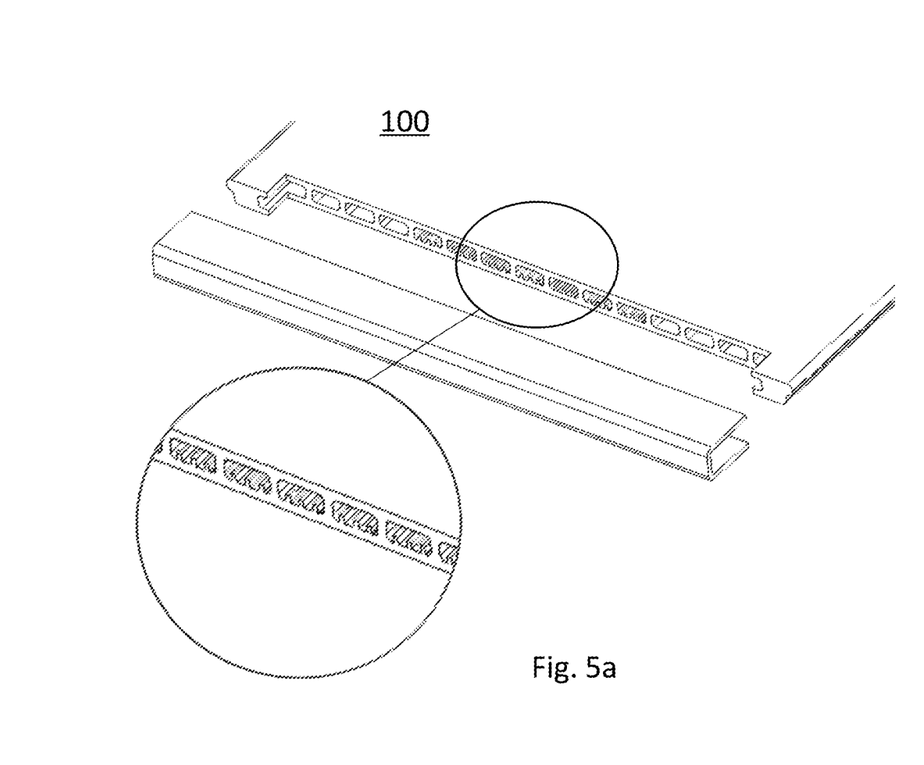
FIG. 5a schematically illustrates a perspective view of a part of a heat spreader according to an embodiment of the present disclosure.

To further improve the thermal performance of the heat spreader 100, the set of separate channels 130 may comprise inner grooves and/or inner ribs. The inner grooves and/or inner ribs are means to increase the inner surface of the separate channels and thereby the cooling capacity of the heat spreader 100. An example of a groove and/or rib pattern is schematically illustrated in FIG. 5a, in which the inner grooves and/or inner ribs extend along the extension of separate channels on one of the inner sides/walls of the one or more separate channels. The inner grooves and/or inner ribs may have an angular shape or be rounded. The groove and/or rib pattern can be applied to one or more of the separate channels. Furthermore, it can be applied on one or more of the inner sides/walls of the one or more separate channels.

In embodiments, the set of separate channels 130 may comprise a wick structure, i.e., a porous structure for capillary fluid transport. The wick structure may be arranged inside at least parts of one or more separate channels at one or more of the inner sides/walls of the one or more separate channels. The wick structure may be arranged at the inner sides of the one or more separate channels facing the front side 102 of the heat spreader 100, i.e., the side configured to be thermally coupled to the electronic heat source 200. The wick structure may further be arranged adjacent to the electronic heat source 200 and cover an area equivalent to or bigger than an area of the electronic heat source 200. In this way, a dry out in the area with highest heat fluxes can be avoided.

Figure 5B:
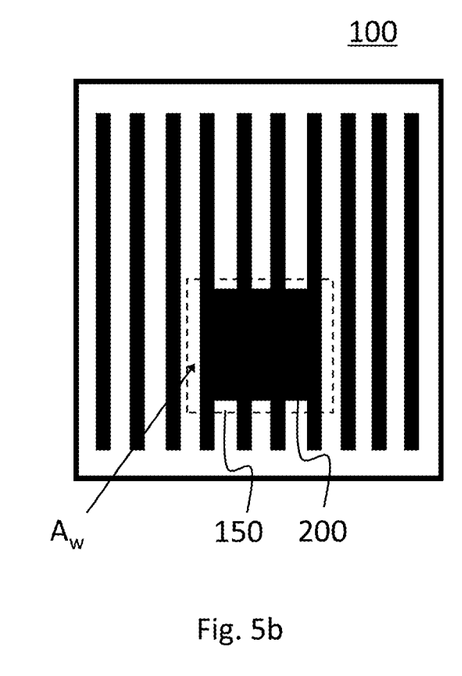
FIG. 5b schematically illustrates a section view of a heat spreader according to an embodiment of the present disclosure.

FIG. 5b indicates the location and size of a wick structure 150 relative to the electronic heat source 200 according to an embodiment of the present disclosure. With reference to FIG. 5b, the wick structure 150 covers an area $A_w$ of the heat spreader 100. The area $A_w$ is larger than and fully overlaps the area covered by the electronic heat source 200. However, other locations and sizes of the wick structure can be used without deviating from the scope of the present disclosure.

The wick structure may be applied by coating. For example, a surface of the inner sides of the one or more separate channels can be coated with the wick structure prior to closing the heat spreader 100. The wick structure may further be a surface treatment of the internal surfaces of the one or more separate channels or an additional mesh, wire or sheet metal structure component inserted into the one or more separate channels.

Figure 6:
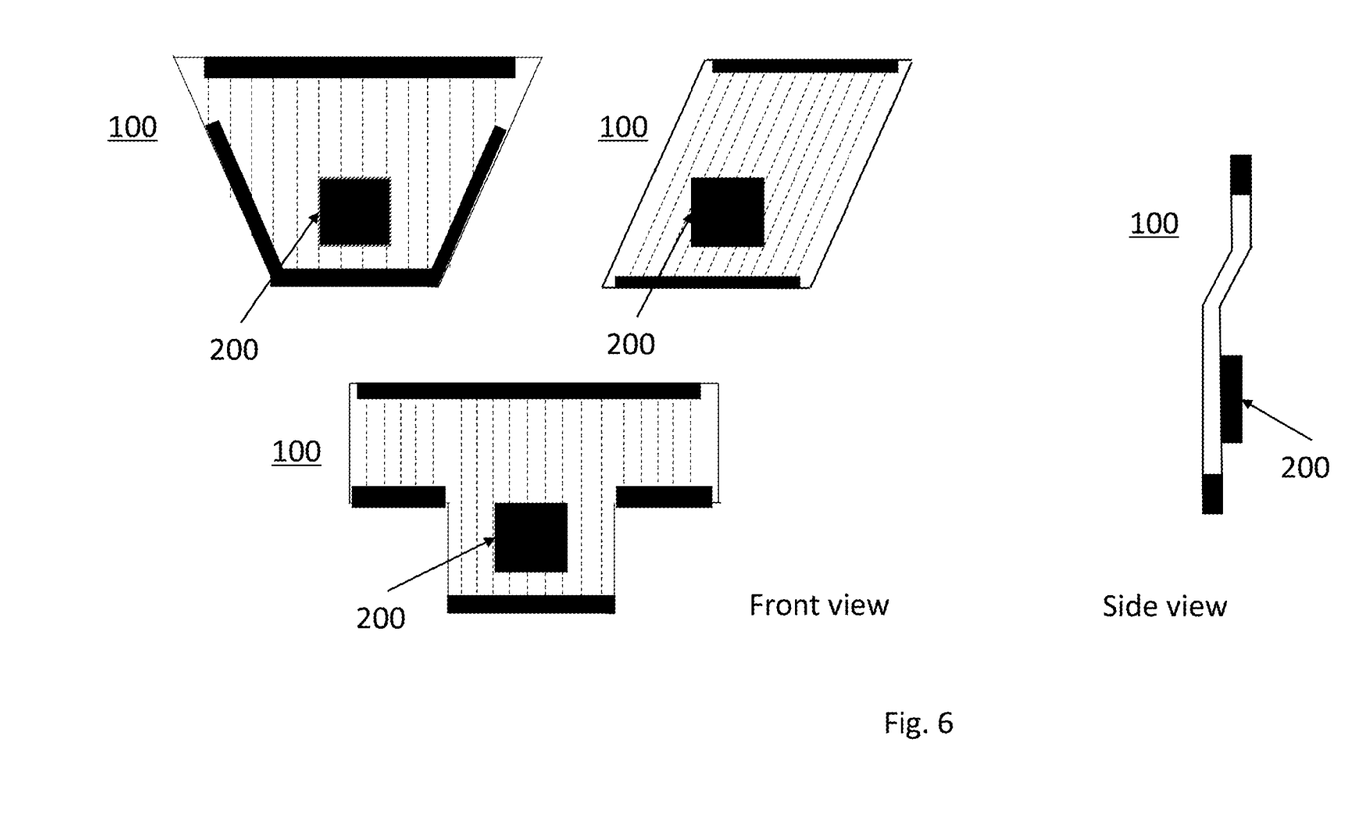
FIG. 6 schematically illustrates examples of different shapes of a heat spreader according to embodiments of the present disclosure.

The general shape of the heat spreader 100 may be essential rectangular or square in a front view and the heat spreader 100 may further be essentially flat in a side view, see, e.g., FIG. 1a-b. However, other shapes are also possible. FIG. 6 shows some non-limiting examples of other possible shapes that the heat spreader 100 may have from the front or side. The heat spreader 100 may, e.g., be a rhombus or have a T-shape. With reference to FIG. 6, the set of separate channels may in some embodiments have different length such as, e.g., in the T-shaped head spreader 100.

As indicated in the figures, the electronic heat source 200 may arranged at a center part or a lower part of the front side 102. This may be beneficial from a gravity point of view and can improve the circulation of the cooling fluid in the heat spreader 100 when in use, i.e., when connected to and heated by the electronic heat source 200.

Figure 7:
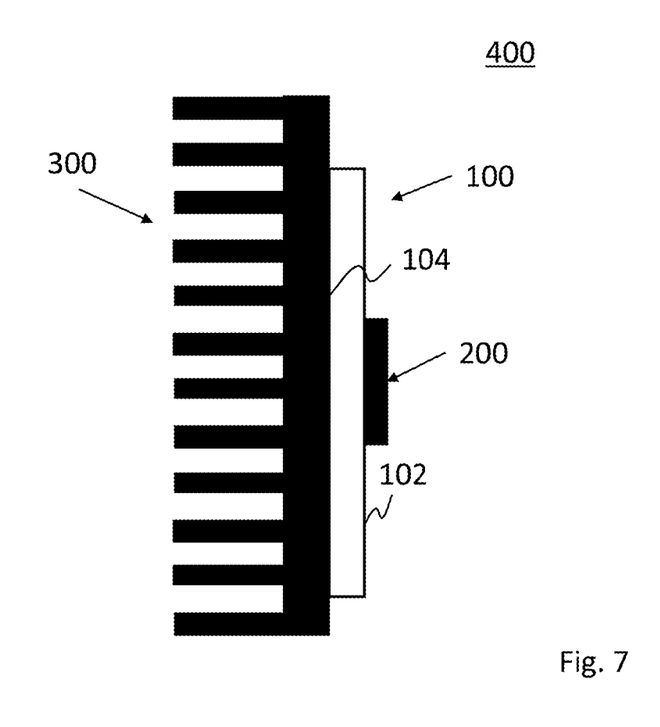
FIG. 7 schematically illustrates a side view of a system according to embodiments of the present disclosure.

The embodiments of the present disclosure also include a system 400 for cooling an electronic heat source 200. FIG. 7 shows the system 400 according to an embodiment of the present disclosure. The system 400 comprises an electronic heat source 200, a heat sink 300, and a heat spreader 100 according to any one of the herein described embodiments. The heat spreader 100 is arranged between the electronic heat source 200 and the heat sink 300 to transfer heat from the electronic heat source 200 to the heat sink 300.

With reference to FIG. 7, the electronic heat source 200 is thermally coupled to the front side 102 of the heat spreader 100. When the electronic heat source 200 generates heat, the heat is transferred to the heat spreader 100 via the thermal coupling and will cause the cooling fluid to circulate within the heat spreader 100. Thereby, spreading the heat generated by the electronic heat source 200 over the heat spreader 100. The surface area of the electronic heat source 200 may be smaller than the surface area of the heat spreader 100, as indicated in FIG. 7.

A solid thermal coupling can be achieved, e.g., using springs to push the heat spreader 100 into contact with the electronic heat source 200 and/or the heat sink 300. The springs may, e.g., be mounted on metal pillars arranged through or beside the heat spreader 100. However, the heat spreader 100 can also be mounted between the electronic heat source 200 and the heat sink 300 without springs, e.g., in a so-called "floating" configuration. The interface between the heat spreader 100 and the electronic heat source 200 and/or heat sink 300 may be filled with thermal interface material such as thermal grease to fill out air voids and reduce the thermal resistance.

Figure 8:
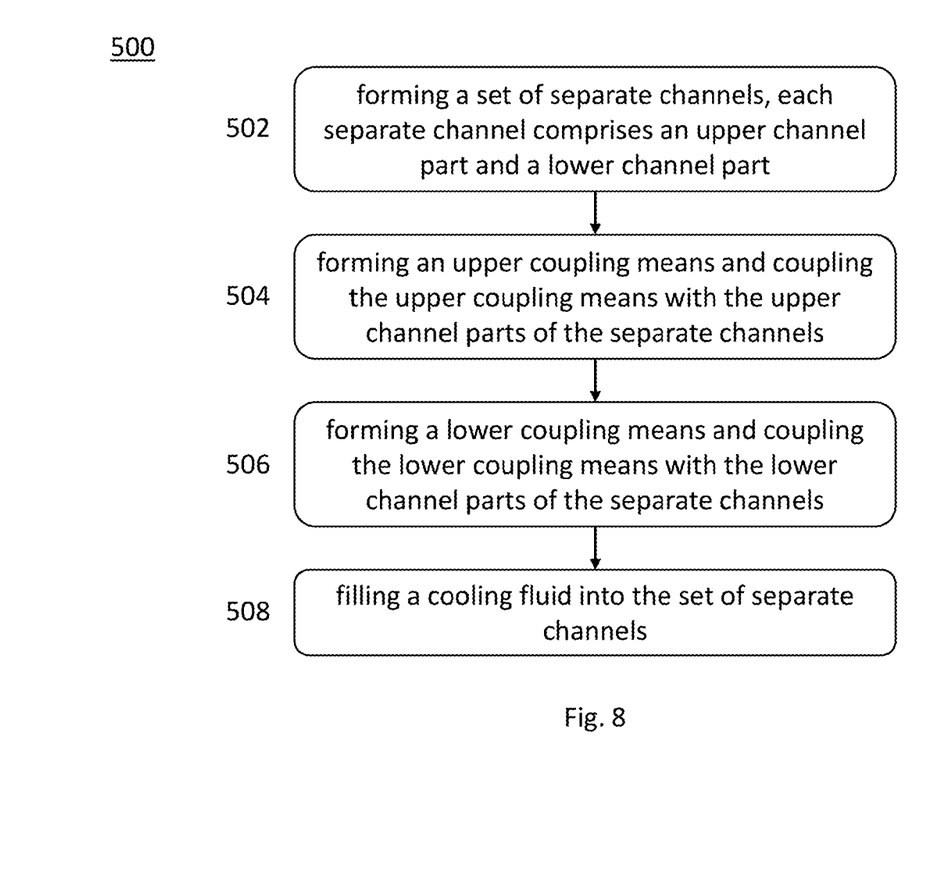
FIG. 8 shows a flow chart of a method according to embodiments of the present disclosure.

The embodiments of the present disclosure also include a method 500 for manufacturing a heat spreader 100 for transferring heat from an electronic heat source 200 to a heat sink 300. FIG. 8 shows a flow chart of the method 500 according to an embodiment of the present disclosure for manufacturing a heat spreader such as the heat spreader shown in FIGS. 1a-b.

The method 500 comprises forming 502 a set of separate channels 130 extending between an upper part 106 of the heat spreader 100 and a lower part 108 of the heat spreader 100. Each separate channel 130 comprises an upper channel part 132 and a lower channel part 134. In embodiments, forming 502 of the set of separate channels 130 may comprise forming the set of separate channels 130 using extrusion or by forming of sheet metal parts. The set of separate channels 130 may, e.g., be extrude from a metal profile, formed by brazing sheet metal parts together, or formed by inserting and connecting a corrugated metal plate into a flat tube.

The method 500 comprises forming 504 an upper coupling means 110 and coupling the upper coupling means 110 with the upper channel parts 132 of the separate channels 130. In embodiments, forming 504 an upper coupling means 110 may comprise forming an upper elongated inner channel 112 coupling the upper channel parts 132 of the set of separate channels 130. The upper elongated inner channel 112 may be partially formed by a separate upper cover part 114 which may extend over and at least partially enclose the upper channel parts 132.

The method 500 comprises forming 506 a lower coupling means 120 and coupling the lower coupling means 120 with the lower channel parts 134 of the separate channels 130. In embodiments, forming 506 a lower coupling means 120 may comprise forming a lower elongated inner channel 122 coupling the lower channel parts 134 of the set of separate channels 130. The lower elongated inner channel 122 may be partially formed by a separate lower cover part 124 which may extend over and at least partially enclose the lower channel parts 134.

The method 500 further comprises filling 508 a cooling fluid into the set of separate channels 130 thereby allowing the cooling fluid to circulate in the set of separate channels 130 via the upper coupling means 110 and the lower coupling means 120 in operation. The filling 508 of the cooling fluid may comprise filling the cooling fluid in the liquid form into the set of separate channels 130 through an opening in the heat spreader 100 which is then sealed, e.g., using welding.

Figure 9:
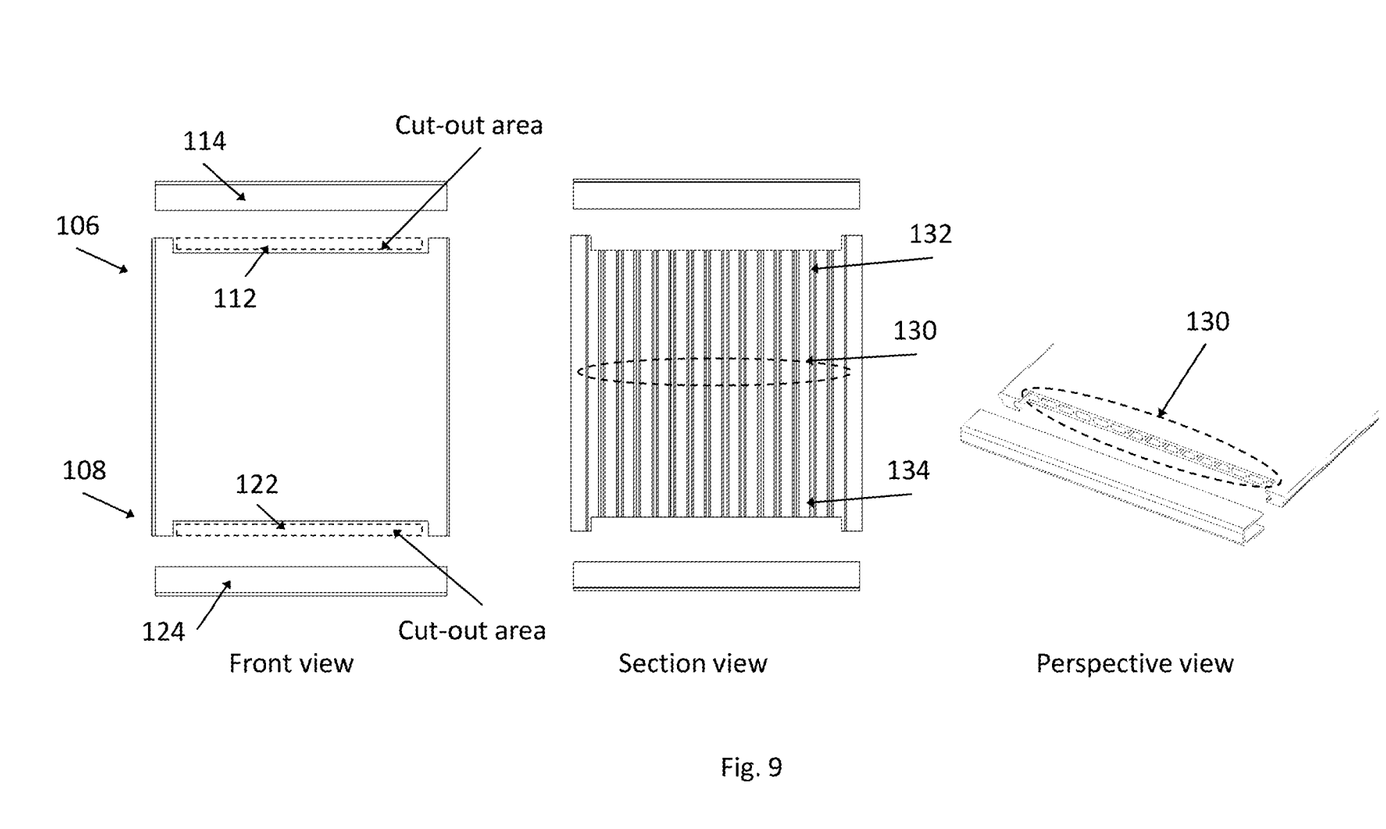
FIG. 9 schematically illustrates different views of a heat spreader according to an embodiment of the present disclosure.

Further details related to the forming of the upper coupling means 110 and the lower coupling means 120 according to an embodiment will now be described with reference to FIG. 9. A set of channels 130 have been formed, e.g., by extrusion, in a metal profile, as shown in the section and perspective views in FIG. 9. A section of the upper part 106 and the lower part 108 of the heat spreader 100 is then removed, e.g., cut-out, to form a cut-out area at the upper part 106 and lower part 108, respectively. The cut-out areas are indicated in the front view in FIG. 9.

The upper coupling means 110 may be formed by covering the upper cut-out area with a separate upper cover part 114. The separate upper cover part 114 may be a U-shaped metal part and attached to the upper part 106 of the heat spreader 100, e.g., by brazing or welding. The separate upper cover part 114 may be shaped and dimensioned to extend over the upper channel parts 132 of the set of separate channels 130 and form an upper elongated inner channel 112 from the cut-out area, when attached to the upper part 106 of the heat spreader 100.

In a similar way, the lower coupling means 120 may be formed by covering the lower cut-out area with a separate lower cover part 124. The separate lower cover part 124 may be a U-shaped metal part and attached to the lower part 108 of the heat spreader 100, e.g., by brazing or welding. The separate lower cover part 124 may be shaped and dimensioned to extend over the lower channel parts 134 of the set of separate channels 130 and form a lower elongated inner channel 122 from the lower cut-out area, when attached to the lower part 108 of the heat spreader 100.

Different cooling fluids can be considered as well as materials in the heat spreader 100. Non-limiting examples are R1233zde, acetone, ammonia, and water. When water is used anti-freezing and anti-corrosion inhibitors may be added to the water. It may be noted that the combination of cooling fluid and material of the heat sink is important. For example, the combination of water and aluminum has low performance since this combination will produce non condensable gas inside the heat spreader 100 which will reduce heat transfer ability. A good combination may be aluminum and R1233zde, and also copper and water.

The manufacturing methods for producing the heat spreader 100 includes but is not limited to die casting, sheet metal punching and stamping, extrusion, or any other suitable method. Any joints in the heat spreader between different parts may be sealed and able to handle internal over pressure.

Finally, it should be understood that the present disclosure is not limited to the embodiments described above, but also relates to and incorporates all embodiments within the scope of the appended independent claims.

What is claimed is:

1. A heat spreader for transferring heat from an electronic heat source to a heat sink, the heat spreader comprising:
    a front side configured to be thermally coupled to the electronic heat source;
    a back side arranged opposite to the front side and configured to be thermally coupled to the heat sink;
    a set of separate channels extending between an upper part of the heat spreader and a lower part of the heat spreader, wherein each separate channel comprises an upper channel part and a lower channel part;
    an upper coupler configured to couple the upper channel parts of the set of separate channels and a lower coupler configured to couple the lower channel parts of the set of separate channels, and a cooling fluid circulates in the set of separate channels via the upper coupler and the lower coupler in operation; and wherein the cooling fluid circulates in the heat spreader in gas form via the upper coupler and in liquid form via the lower coupler in operation.

2. The heat spreader-according to claim 1, wherein
the upper coupler comprises an upper elongated inner channel coupling the upper channel parts of the set of separate channels; and/or
the lower coupler comprises a lower elongated inner channel coupling the lower channel parts of the set of separate channels.

3. The heat spreader according to claim 2, wherein
the upper elongated inner channel is partially formed by a separate upper cover part; and/or
the lower elongated inner channel is partially formed by a separate lower cover part.

4. The heat spreader according to claim 3, wherein
the separate upper cover part extends over and at least partially encloses the upper channel parts; and/or
the separate lower cover part extends over and at least partially encloses the lower channel parts.

5. The heat spreader according to claim 1, wherein the set of separate channels extends in a plane substantially in parallel with an extension plane of the front side.

6. The heat spreader according to claim 5, wherein the set of separate channels is arranged in a row in the plane.

7. The heat spreader according to claim 5, wherein the set of separate channels extends in parallel to each other in the plane.

8. The heat spreader according to claim 1, wherein a fluid area of a separate channel is same or different in the set of separate channels.

9. The heat spreader according to claim 1, wherein a spatial distance between two adjacent separate channels is same or different in the set of separate channels.

10. The heat spreader according to claim 8, wherein the fluid area is dependent on a spatial distance to the electronic heat source.

11. The heat spreader according to claim 10, wherein the fluid area decreases with an increasing spatial distance to the electronic heat source.

12. The heat spreader according to claim 1, wherein the set of separate channels comprises inner grooves and/or inner ribs.

13. The heat spreader according to claim 1, wherein the electronic heat source is arranged at a center part or a lower part of the front side.

14. A system for cooling an electronic heat source, comprising:
the electronic heat source;
a heat sink; and
a heat spreader for transferring heat from the electronic heat source to the heat sink, wherein the heat spreader comprises:
a front side configured to be thermally coupled to the electronic heat source;
a back side arranged opposite to the front side and configured to be thermally coupled to the heat sink;
a set of separate channels extending between an upper part of the heat spreader and a lower part of the heat spreader, wherein each separate channel comprises an upper channel part and a lower channel part; and
an upper coupler configured to couple the upper channel parts of the set of separate channels and a lower coupler configured to couple the lower channel parts of the set of separate channels, and a cooling fluid circulates in the set of separate channels via the upper coupler and the lower coupler in operation, and
wherein the cooling fluid circulates in the heat spreader in gas form via the upper coupler and in liquid form via the lower coupler in operation.

15. The system according to claim 14, wherein
the upper coupler comprises an upper elongated inner channel coupling the upper channel parts of the set of separate channels; and/or
the lower coupler comprises a lower elongated inner channel coupling the lower channel parts of the set of separate channels.

16. The system according to claim 15, wherein
the upper elongated inner channel is partially formed by a separate upper cover part; and/or
the lower elongated inner channel is partially formed by a separate lower cover part.

17. The system according to claim 16, wherein
the separate upper cover part extends over and at least partially encloses the upper channel parts; and/or
the separate lower cover part extends over and at least partially encloses the lower channel parts.

18. A method for manufacturing a heat spreader for transferring heat from an electronic heat source to a heat sink, the method comprising:
forming a set of separate channels extending between an upper part of the heat spreader and a lower part of the heat spreader, wherein each separate channel comprises an upper channel part and a lower channel part;
forming an upper coupler and coupling the upper coupler with the upper channel parts of the separate channels;
forming a lower coupler and coupling the lower coupler with the lower channel parts of the separate channels;
filling a cooling fluid into the set of separate channels, wherein the cooling fluid circulates in the set of separate channels via the upper coupler and the lower coupler in operation, and
wherein the cooling fluid circulates in the heat spreader in gas form via the upper coupler and in liquid form via the lower coupler in operation.

19. The method according to claim 18, wherein
the upper coupler comprises an upper elongated inner channel coupling the upper channel parts of the set of separate channels; and/or
the lower coupler comprises a lower elongated inner channel coupling the lower channel parts of the set of separate channels.

20. The method according to claim 19, wherein
the upper elongated inner channel is partially formed by a separate upper cover part; and/or
the lower elongated inner channel is partially formed by a separate lower cover part.

* * * * *